(12) United States Patent
Kasuya et al.

(10) Patent No.: US 8,810,016 B2
(45) Date of Patent: Aug. 19, 2014

(54) SEMICONDUCTOR DEVICE, SUBSTRATE AND SEMICONDUCTOR DEVICE MANUFACTURING METHOD

(75) Inventors: Yasumasa Kasuya, Kyoto (JP); Motoharu Haga, Kyoto (JP); Hiroaki Matsubara, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 69 days.

(21) Appl. No.: 13/036,869

(22) Filed: Feb. 28, 2011

(65) Prior Publication Data

US 2011/0140256 A1    Jun. 16, 2011

Related U.S. Application Data

(62) Division of application No. 11/887,103, filed on Sep. 25, 2007, now abandoned.

(30) Foreign Application Priority Data

Jun. 6, 2005    (JP) .................................. 2005-165800
Sep. 13, 2005   (JP) .................................. 2005-266004

(51) Int. Cl.
*H01L 23/495*    (2006.01)

(52) U.S. Cl.
USPC .................................... 257/676; 257/E23.066

(58) Field of Classification Search
USPC ........... 257/666–671, E23.031, E23.066, 676
See application file for complete search history.

(56) References Cited

U.S. PATENT DOCUMENTS

| | | | |
|---|---|---|---|
| 5,756,380 A * | 5/1998 | Berg et al. ...................... | 438/126 |
| 5,864,470 A * | 1/1999 | Shim et al. .................... | 361/777 |
| 5,973,932 A * | 10/1999 | Nguyen ......................... | 361/779 |
| 6,282,094 B1 * | 8/2001 | Lo et al. ......................... | 361/704 |
| 6,538,313 B1 * | 3/2003 | Smith ............................ | 257/684 |
| 6,881,278 B2 * | 4/2005 | Amita et al. .................... | 148/23 |
| 7,416,106 B1 * | 8/2008 | Downes et al. ........... | 228/180.21 |
| 2002/0089053 A1 * | 7/2002 | Liu et al. ....................... | 257/690 |
| 2002/0149099 A1 | 10/2002 | Shirasaka et al. | |
| 2002/0179327 A1 | 12/2002 | Araki | |
| 2003/0001260 A1 * | 1/2003 | Azuma ........................ | 257/731 |
| 2003/0205791 A1 | 11/2003 | Yamaguchi | |
| 2005/0098074 A1 | 5/2005 | Yamaguchi | |
| 2005/0218529 A1 * | 10/2005 | Gohlke et al. ................ | 257/782 |
| 2006/0033185 A1 * | 2/2006 | Kummerl et al. ............. | 257/666 |
| 2006/0166397 A1 * | 7/2006 | Lau et al. ...................... | 438/106 |
| 2006/0286711 A1 * | 12/2006 | Mangold ....................... | 438/106 |

(Continued)

FOREIGN PATENT DOCUMENTS

| | | |
|---|---|---|
| CN | 1381886 A | 11/2002 |
| JP | 6326141 | 11/1994 |

(Continued)

*Primary Examiner* — Daniel Luke
*Assistant Examiner* — Latanya N Crawford
(74) *Attorney, Agent, or Firm* — Rabin & Berdo, P.C.

(57) ABSTRACT

The semiconductor device can prevent damages on a semiconductor chip even when a soldering material is used for bonding the back surface of the semiconductor chip to the junction plane of a chip junction portion such as an island or a die pad. This semiconductor device includes a semiconductor chip and a chip junction portion having a junction plane that is bonded to the back surface of the semiconductor chip with a soldering material. The junction plane is smaller in size than the back surface of the semiconductor chip. This semiconductor device may further include a plurality of extending portions which extend respectively from the periphery of the junction plane to directions parallel with the junction plane.

8 Claims, 10 Drawing Sheets

(56) References Cited

U.S. PATENT DOCUMENTS

2007/0001275 A1    1/2007   Shirasaka et al.
2008/0001263 A1*   1/2008   Dimaano et al. .............. 257/666

FOREIGN PATENT DOCUMENTS

| | | |
|---|---|---|
| JP | 09-107173 A | 4/1997 |
| JP | 9-162203 | 6/1997 |
| JP | 11-067953 | 3/1999 |
| JP | 2000-174168 A | 6/2000 |
| JP | 2001-087953 | 4/2001 |
| JP | 2001-181563 | 7/2001 |
| JP | 2002-353255 | 12/2002 |
| JP | 2002-368156 A | 12/2002 |
| JP | 2005-079486 A | 3/2005 |

\* cited by examiner

PRIOR ART

PRIOR ART

FIG. 11 (a) PRIOR ART
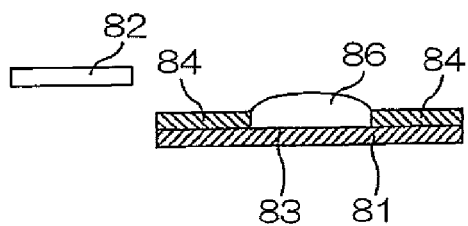
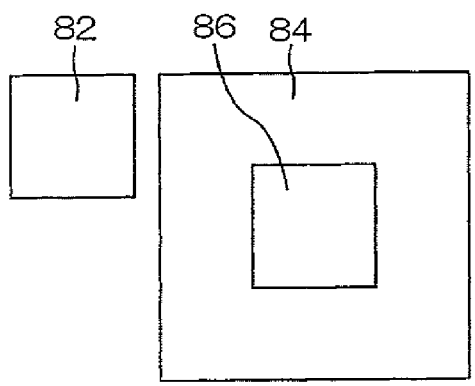
FIG. 11 (b) PRIOR ART
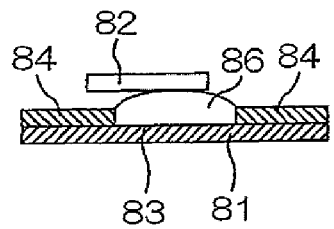
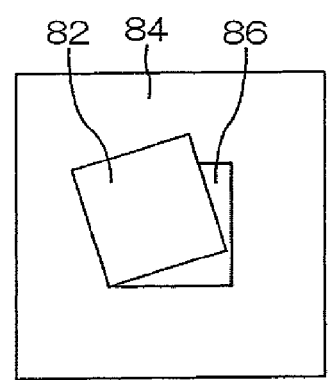
FIG. 11 (c) PRIOR ART
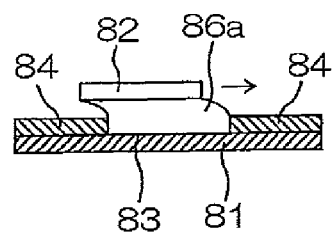
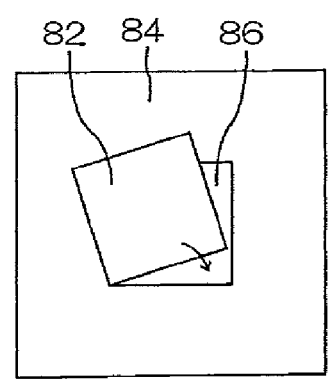
FIG. 11 (d) PRIOR ART
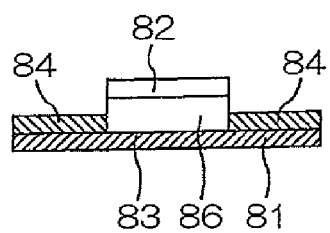
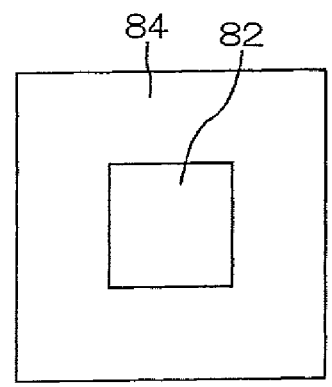

SEMICONDUCTOR DEVICE, SUBSTRATE AND SEMICONDUCTOR DEVICE MANUFACTURING METHOD

CROSS-REFERENCE TO RELATED APPLICATIONS

This application is a divisional of application Ser. No. 11/887,103, filed on Sep. 25, 2007. Furthermore, this application claims the benefit of priority of Japanese applications 2005-165800, filed Jun. 6, 2005 and 2005-266004, filed Sep. 13, 2005. The disclosures of these prior Japanese applications are incorporated herein by reference.

TECHNICAL FIELD

The present invention relates to a semiconductor device, a substrate and a method for manufacturing the semiconductor device.

BACKGROUND ART

As a surface mounting type package, BGA (Ball Grid Array) is typically known.

FIG. 9 is an illustrative sectional view showing a configuration of a semiconductor device which adopts the BGA. The semiconductor device includes a semiconductor chip 101, an interposer 102 equipped with the semiconductor chip 101, and a sealing resin 103. The sealing resin 103 seals the semiconductor chip 101 as well as a surface that opposes to the semiconductor chip 101 on the interposer 102.

The interposer 102 has a resin substrate 104 formed of an insulative resin as a base substrate and includes an island 105 and a plurality of internal terminals 106 on one side of the resin substrate 104. The island 105 is formed in a generally rectangular shape with a size greater than the semiconductor chip 101 as seen from top. The island 105 is bonded to the back surface of the semiconductor chip 101 with a bonding material 107. A plurality of internal terminals 106 are disposed around the island 105 and electrically connected by a bonding wire 108 to the electrode pad (not shown) on the front surface of the semiconductor chip 101 that is bonded to the island 105. On the other surface of the resin substrate 104, a plurality of ball shaped external terminals 109 are disposed in an aligned manner for electrically connected to a land on the mounting substrate (printed wiring board). The internal terminals 106 on one surface of the resin substrate 104 and the external terminals 109 on the other surface of the resin substrate 104 are electrically connected via a metal provided within a through hole (not shown) that extends from one surface to the other surface of the resin substrate 104.

In such semiconductor devices, an epoxy resin bonding adhesive, a silver paste, or an insulating paste is typically used as the bonding material 107 for bonding the semiconductor chip 101 to the island 105. Bonding materials using a soldering material have not been provided at present for this purpose.

For example, a semiconductor chip built with a power IC operates with the back surface (the back surface of a semiconductor substrate) serving as a ground. For this reason, in the case where a semiconductor chip built with the power IC is provided as the semiconductor chip 101 shown in FIG. 9, the islands 105 and the external terminals 109 are electrically connected, and at the same time, the back surface of the semiconductor chip 101 must be bonded to the islands 105 with an electrically conductive bonding material 107. However, in the case where the soldering material is employed as the bonding material 107, when the temperature of the semiconductor device changes rapidly or drops after the bonding under high temperatures, the peripheral portion on the back surface side of the semiconductor chip 101 may be applied with a stress from the bonding material 107 and this may cause damages such as crack at the peripheral portion. When the soldering material is employed as the bonding material 107, for example, a reflow soldering is absolutely required. During the cooling process after the reflow soldering, a difference in heat shrinkage amount is generated between the interposer 102 (resin substrate 104) and the semiconductor chip 101 and causes a stress. The stress caused by the difference in heat shrinkage amount is then transferred from the bonding material 107 to the peripheral portion on the back surface of the semiconductor chip 101.

Such problem also occurs in the case where a semiconductor chip is bonded with a soldering material to a dye pad of a lead frame having a relatively small thickness.

On the other hand, methods of die bonding a semiconductor chip include a method including the steps of forming a lead frame or a plating layer such as silver, palladium, and gold on the surface of the organic substrate or the like, applying solder thereto, using the applied solder as a bonding material, and then pressing and mounting a semiconductor chip to the bonding material.

Along with recent development of a highly integrated semiconductor chip, the advancement of a wire bonding technology has achieved a bonding pad having a smaller and finer pitch, and as a result, the number of wire bonding that is able to be connected in a semiconductor chip having an identical size, in other words, the number of the bonding wires required for wiring a single semiconductor chip, is in the increase.

Accordingly, this tends to cause various problems including: failures in wire bonding due to misalignment of a semiconductor chip, failures such as edge touch and short circuit due to the nonuniform loop-like shape of the bonding wire after the wire bonding process, or failures due to a narrow space between bonding wires. Consequently, a precise mounting positioning is required when mounting the semiconductor chip.

In order to solve these problems, the alignment process has been conventionally performed in such a way that two components to be aligned with each other are provided with a portion having a greater wettability and a portion having a less wettability, and the portion with greater wettability is applied with a liquid such as a bonding adhesive and is overlapped with the other component to change the relative position of the two components by way of the surface tension of the liquid (see Patent Document 2, for example).

With referring to FIGS. 10(a) and 10(b) and FIGS. 11(a) through 11(d), the case in which the alignment method disclosed in Patent Document 2 is adopted as the die bonding process of the semiconductor chip will be described hereinafter.

FIG. 10(a) is a plan view schematically showing an example of an island used in the conventional die bonding process, and FIG. 10(b) is a longitudinal sectional view schematically showing the island.

As shown in FIGS. 10(a) and 10(b), on a part of the surface of an island 81, a solder-resist is applied and a solder-resist layer 84 is formed. A metal surface 83 is not applied with the solder-resist and the island 81 is exposed thereon, whereby the metal surface 83 is easily wet by solder. On the other hand, on the solder-resist layer 84 the solder is difficult to wet. The metal surface 83 has a square shape, which is identical with the shape of the back surface of the semiconductor chip which is subject to subsequent die bonding process.

FIGS. 11(a) through FIG. 11(d) are a flow chart schematically showing an example of conventional die bonding processes.

First, a solder 86 is applied on the metal surface 83 on the island 81 by using a metal mask as shown in FIG. 11(a). Then, a semiconductor chip 82 is pressed against the solder 86 for fixing the semiconductor chip 82 as shown in FIG. 11(b). Next, the solder 86 is heated to melt as shown in FIG. 11(c). The resultant molten solder 86a spreads over the entire bottom surface of the semiconductor chip 82 and then the semiconductor chip 82 moves under the influence of a surface tension toward a direction in which the metal surface 83 and the semiconductor chip 82 are opposed to each other, as shown in FIG. 11(c). With this movement, the metal surface 83 of the island 81 and the semiconductor chip 82 are opposed to each other as shown in FIG. 11(d), and the alignment is complete.

In accordance with the process mentioned above, the formation of the solder-resist layer 84 on a particular portion of the island 81 can provide two separate portions: one portion where the solder 86 does not wet (solder-resist layer 84) and the other portion where the solder 86 easily wets (metal surface 83). Under the influence of surface tension which acts to minimize the surface area of the droplet, the molten solder 86a pull the semiconductor chip 82 onto the metal surface 83 which is a target mounting position of the semiconductor chip 82. The metal surface 83 on the island 81 and the semiconductor chip 82 are thus opposed with each other to perform the alignment.

However, as the semiconductor chip 82 moves in a manner to oppose to the metal surface 83 under the influence of surface tension of the molten solder 86a, the difference between the surface area of the molten solder 86a that is on the move and the surface area of the molten solder 86a that is in an opposed state gradually becomes smaller. Accordingly, the force to attract the semiconductor chip 82 by the action of surface tension gradually becomes weaker. Accordingly, due to the resistance force and the like that are caused by the viscosity of the solder, there exists some cases where it is impossible for the semiconductor chip 82 to move to a predetermined target position, and also there exists a problem that the semiconductor chip 82 cannot move precisely to a target position on the island 81.

Patent Document 1: Japanese Unexamined Patent Publication No. 2001-181563
Patent Document 2: Japanese Unexamined Patent Publication No. 2001-087953

SUMMARY OF THE INVENTION

Problems to be Solved

It is an object of the present invention to provide a semiconductor device which can prevent damages in the semiconductor chip even with the use of a soldering material for bonding the back surface of the semiconductor chip to the bonding surface of chip junction portion such as an island or a dye pad.

It is another object of the present invention to provide a semiconductor device, substrate, and methods for manufacturing the same, which allows precise die bonding of the semiconductor chip on the island.

Solution to the Problems

The semiconductor device according to one aspect of the present invention includes a semiconductor chip and a chip junction portion having a junction plane being bonded to the back surface of the semiconductor chip with a bonding material, wherein the area of the junction plane is made smaller than the area of the back surface of the semiconductor chip.

According to this configuration, since the area of the junction plane of the chip junction portion is smaller in size than the area of the back surface of the semiconductor chip, when, for example, a soldering material (creamy solder) is applied on the junction plane of the chip junction portion and a semiconductor chip is disposed on the soldering material, the soldering material will not slip off the side surface of the semiconductor chip. Consequently, even in the case where a difference in the heat shrinkage level is caused between the semiconductor chip and the chip junction portion when the temperature of the semiconductor device changes rapidly or drops after the junction process under high temperatures, the configuration can prevent the application of the stress on the peripheral portion of the back surface of the semiconductor chip and can thus prevent damages on the semiconductor chip.

It is preferable that the soldering material is one in which several types of soldering powders, different in grain size and melting point (composition), are mixed in a flux. Since in such a soldering material density of the soldering powders in the flux is high, the generation of voids therein can be prevented at the time of reflow melting process. Even when voids are generated, since the melting points of the soldering powders are different, the generated voids can be pushed out of the soldering material. The back surface of the semiconductor chip and the junction plane of the chip junction portion can thus be favorably bonded therebetween.

Additionally, it is preferable that the semiconductor device further includes a plurality of extending portions that extend from the periphery of the junction plane in directions parallel to the junction plane. With this configuration, a soldering material is applied on the junction plane of the chip junction portion and a semiconductor chip is disposed on the soldering material to perform reflow soldering. Then, the soldering material is melt and the resulting melted liquid flows to move the semiconductor chip on the chip junction portion. Since the plurality of extending portions are provided, even when the semiconductor chip is disposed accidentally in a position displaced to a certain side of the extending portion, the melted liquid of the soldering material flows more into other extending portions. The flow of the melted liquid can lead the semiconductor chip at the center on the junction plane. For this reason, the semiconductor chip can be disposed on the junction plane with a greater tolerance, improving the productivity of the semiconductor device.

As seen from top of the surface of the semiconductor chip to perpendicularly downward, the tip of the extending portion may reach the outside of the periphery of the semiconductor chip in a state where the semiconductor chip is bonded to the junction plane.

Further, it is preferable that the junction plane is formed in a rectangular shape and that the extending portion extends from a corner of the junction plane.

Moreover, it is more preferable that the extending portion extends from each of the four corners of the junction plane.

The semiconductor device according to another aspect of the present invention includes a semiconductor chip, an island to which the semiconductor chip is die-bonded with a die bonding material, and a coating layer formed on a part of the surface of the island and formed of the die bonding material which is difficult to wet than the island. The exposed portion of the island which forms no coating layer includes a die bonding portion which is opposed to the back surface of the semiconductor chip and has a size smaller than the back surface of the semiconductor chip, and an alignment portion extending from the die bonding portion such that it includes a position that is opposed to the corner of the back surface of the semiconductor chip in the island.

According to this configuration, the exposed portion of the island that forms no coating layer includes the die bonding portion which is opposed to the back surface of the semiconductor chip and has a size smaller than the back surface of the semiconductor chip, and the alignment portion extending from the die bonding portion such that it includes a position that is opposed to the corners of the back surface of the semiconductor chip in the island. The corners of the semiconductor chip are positioned on the alignment portion. Since the corners of the semiconductor chip are positioned on the alignment portion, and the die bonding is precisely performed, the nonuniform formation of the shape (loop shape) of the bonding wire can be prevented and the space between the bonding wires can also be prevented from becoming narrower.

It is preferable that the die bonding material is a solder. In this case, it is preferable that the coating layer is formed of a material that the solder does not wet. This configuration uses a solder with a relatively low viscosity at the time of melting. Accordingly, in the alignment process in which the semiconductor chip is aligned at the time of the die bonding, the solder is melted to precisely move the corners of the semiconductor chip to desired target positions on the alignment portion to achieve a precise alignment. As a result, the semiconductor chip is more precisely die-bonded and thus ensures to prevent the nonuniform formation of the shape (loop shape) of the bonding wire and can also prevent the space between the bonding wires from becoming narrow.

The substrate according to the present invention includes an island that is die-bonded to the semiconductor chip with a die bonding material, and a coating layer formed on a part of the surface of the island and formed of a die bonding material which is difficult to wet more than the island. The exposed portion of the island which forms no coating layer includes a die bonding portion which is opposed to the back surface of the semiconductor chip and has a size smaller than the back surface of the semiconductor chip, and an alignment portion extending from the die bonding portion such that it includes positions that are opposed to the corners of the back surface of the semiconductor chip on the island.

According to this configuration, the exposed portion that forms no coating layer of the island includes a die bonding portion which is opposed to the back surface of the semiconductor chip to be die-bonded and has a size smaller than the back surface of the semiconductor chip, and an alignment portion extending from the die bonding portion such that it includes positions that are opposed to the corners of the back surface of the semiconductor chip in the island. Accordingly, in the alignment process in which the semiconductor chip is aligned at the time of die bonding, the solder is melted to attract the corners of the semiconductor chip to the alignment portion. In such manner, the surface tension which moves the semiconductor chip to the target position acts effectively for a precise alignment of the semiconductor chip. Consequently, use of this substrate in the manufacture of semiconductor device can avoid failures caused by a misalignment of the semiconductor device.

By way of forming the coating layer in which the bonding material is difficult to wet more than the island, the portion on which no coating layer is formed, that is, the portion of greater wettability (exposed portion), can be formed in a particular shape. In this manner, the exposed portion is formed in order to allow the surface tension which moves the semiconductor chip to a target position to act effectively in accordance with a shape of the semiconductor chip to be die-bonded. Accordingly, in the present invention, semiconductor devices which have different shapes of semiconductor chips can be manufactured using a common substrate only by changing a shape of an exposed portion formed on the island.

It is preferable that the die bonding material is a solder. In this case, it is preferable that the coating layer is formed of a material which does not wet the solder. According to this configuration, a solder with a relatively low viscosity at the time of melting will be used. Accordingly, in the alignment process in which the semiconductor chip is aligned at the time of the die bonding, the solder is melted to precisely move the corners of the semiconductor chip to desired target positions on the alignment portion to achieve a precise alignment. As a result, more precise die bonding can be achieved and the use of this substrate for manufacture of the semiconductor device can avoid failures of the semiconductor device caused by the misalignment of semiconductor chip.

The method for manufacturing the semiconductor device according to the present invention includes a step for preparing an island. On a part of the surface of the island is formed with a coating layer of which die bonding material is difficult to wet more than the island. The exposed portion that forms no coating layer includes a die bonding portion which has a size smaller than the back surface of the semiconductor chip, and an alignment portion extending from the die bonding portion such that it includes positions to be opposed to the corners of the back surface of the semiconductor chip. The manufacturing method further includes the steps of: coating the die bonding material on the exposed portion; having the back surface of the semiconductor chip opposed to the die bonding portion and mounting the semiconductor chip on the island that is applied with the die bonding material in the previous coating process; and aligning the position of the semiconductor chip by melting the die bonding material for moving the corners of the semiconductor chip on the alignment portion.

According to this process, the exposed portion of the island that forms no coating layer includes a die bonding portion which is opposed to the back surface of the semiconductor chip to be die-bonded and has a size smaller than the back surface of the semiconductor chip, and an alignment portion extending from the die bonding portion such that it includes positions that are opposed to the corners of the back surface of the semiconductor chip. Accordingly, after mounting the semiconductor chip on the island, in the alignment process, the die bonding material is melted to attract the corners of the semiconductor chip onto the alignment portion. In such manner, the surface tension which moves the semiconductor chip to a target position acts effectively for a precise alignment of the semiconductor chip and can thus avoid failures of the semiconductor device caused by the misalignment of semiconductor chip.

It is preferable that the process for preparing the island includes a coating layer forming process for forming the coating layer by coating a material which is difficult to wet more than the island on the surface of the island except for a region corresponding to the exposed portion. In other words, the die bonding portion and the alignment portion are formed by coating the material of which die bonding material is difficult to wet in order to render the surface tension which moves the semiconductor chip to a target position to act effectively in accordance with the shape of the back surface of the semiconductor chip to be die-bonded. In this manner, even in the case of manufacturing several types of semiconductor devices which have different shapes of semiconductor chips to be die-bonded, the die bonding portion and the alignment portion to be formed may simply change their shape in accordance with the shapes of the semiconductor chip to be die-bonded. In this way, different shapes of semiconductor devices can be easily manufactured using a common substrate.

It is preferable that the die bonding material is a solder. In this case, it is preferable that the coating layer is formed of a material which does not wet the solder. According to this method, a solder with a relatively low viscosity at the time of melting is used for die-bonding. Accordingly, the solder is melted to precisely move the corners of the semiconductor chip to desired target positions on the alignment portion. As a result, more precise die bonding can be achieved and can thus avoid failures of semiconductor device due to the misalignment of the semiconductor chip.

These and other objects, features and effects of the present invention will become apparent from the description of the following embodiments with reference to the attached drawings.

BRIEF DESCRIPTION OF THE DRAWINGS

FIGS. 11(a) through 11(d) are a flow chart schematically showing an example of conventional die bonding processes.

DESCRIPTION OF REFERENCE NUMERALS

1 . . . semiconductor chip, 2 . . . interposer (chip junction portion), 7 . . . junction plane, 8 . . . extending portion, 10 . . . back surface, 11 . . . soldering material, 31 . . . semiconductor device, 32 . . . semiconductor chip, 32a . . . angles, 32b . . . back surface, 33 . . . solder, 33a . . . molten solder, 35 . . . island, 36 . . . exposed portion, 37 . . . solder-resist layer, 38 . . . electrodes, 40 . . . die bonding portion, 40a . . . top portions, 41 . . . alignment portion, 42 . . . angular position, 50 . . . lead terminals, 51 . . . wires, 53 . . . resin package portion, 60 . . . lead frame

BEST MODE FOR CARRYING OUT THE INVENTION

Figure 1:
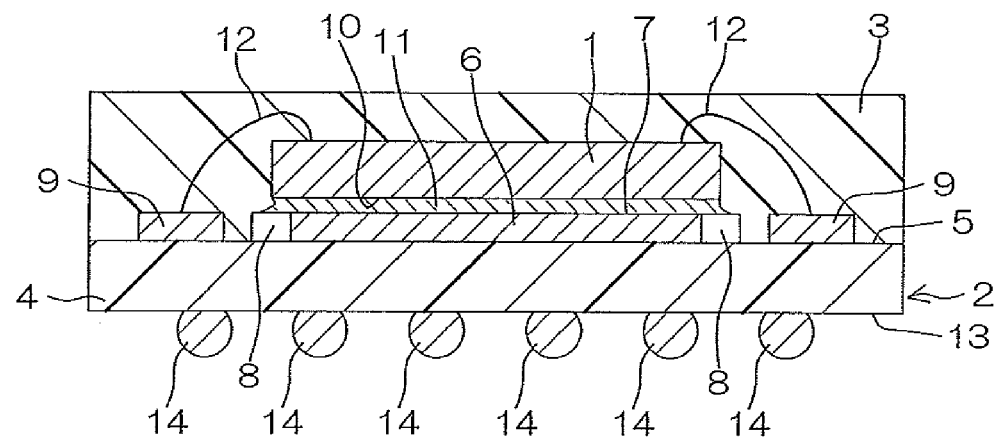
FIG. 1 is an illustrative sectional view showing a configuration of one embodiment according to the present invention.

FIG. 1 is an illustrative sectional view showing a configuration of an embodiment according to the present invention. The semiconductor device adopts BGA (Ball Grid Alley) and includes a semiconductor chip 1, an interposer 2 mounted with the semiconductor chip, and a sealing resin 3. The sealing resin 3 seals the semiconductor chip 1 and the surface of the interposer 2 that is opposed to the semiconductor chip 1.

A power IC is built in the semiconductor substrate (silicon substrate, for example) which is a base substance of the semiconductor chip 1. The uppermost surface of the semiconductor chip 1 is covered with a surface protective film and a plurality of electrode pads (not shown) are exposed from the surface on the peripheral portion.

The interposer 2 includes a resin substrate 4 that is formed of an insulative resin (glass epoxy resin, for example).

Figure 2:
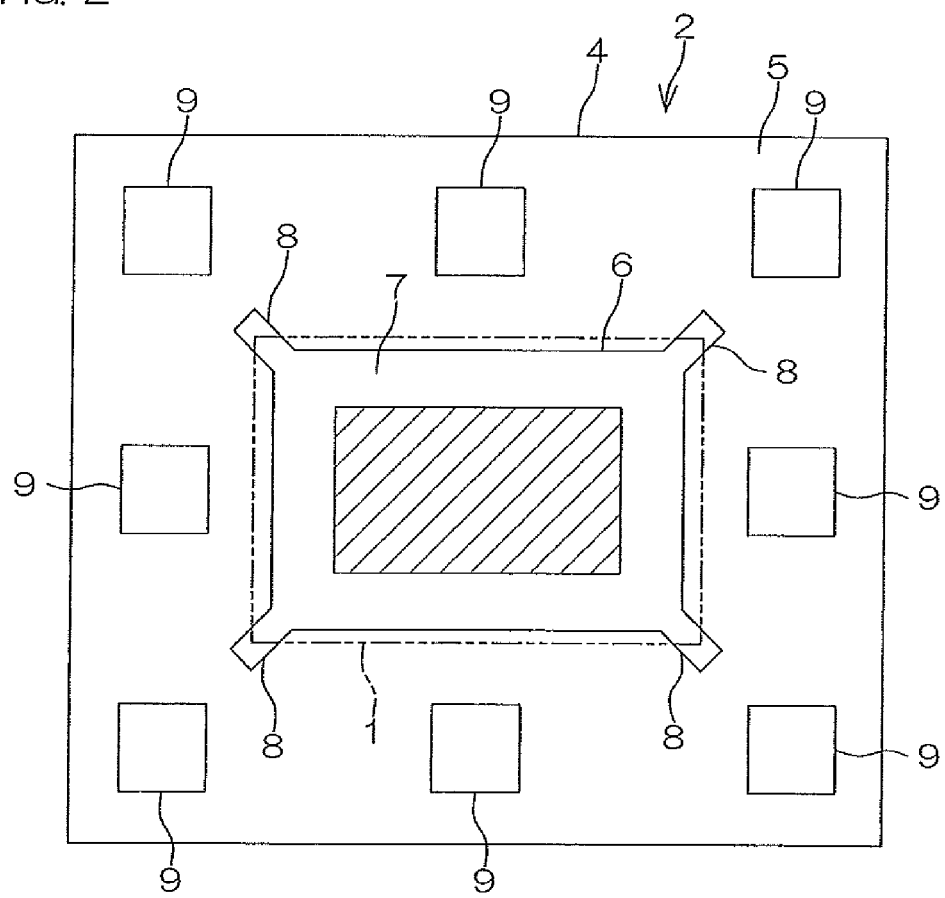
FIG. 2 is a plan view of an interposer equipped in the semiconductor device shown in FIG. 1.

One side surface 5 (the upper surface) of the resin substrate 4 is integrally formed with an island 6 having a rectangular shape as seen from top and an extending portion 8 extending from each of the four angular portions (four corners) of the island 6 in a direction parallel to a surface 7 of the island 6 (a direction along the one side surface 5 of the resin substrate 4), as shown in FIG. 2. In addition, in the periphery of the island 6 and the extending portion 8, a plurality of internal terminals 9 are formed with an appropriate space with each other. The island 6, extending portion 8, and the internal terminals 9 can be formed of plating of metal materials such as a copper and the like.

The island 6 is formed in a smaller size (contour) as seen from top than the semiconductor chip 1, and the back surface 10 of the semiconductor chip 1 is bonded to the surface 7 of the island 6 with a bonding material 11. In other words, the surface 7 of the island 6 is a junction plane bonded to the back surface 10 of the semiconductor chip 1 with the bonding material 11 and the area of the surface 7 is smaller in size than the back surface 10 of the semiconductor chip 1. Bonding of the back surface 10 of the semiconductor chip 1 to the junction plane 7 of the island 6 with the bonding material 11 allows the mounting (die bonding) of the semiconductor chip 1 on the interposer 2.

The four extending portions 8 form a radial shape extending from the respective angular portions of the island 6 toward the periphery of the resin substrate 4. Each of the extending portions 8 has a tip that reaches the outer side of the periphery of the semiconductor chip 1 as seen from top when the semiconductor chip 1 is bonded on the island 6.

Each of the internal terminals 9 is connected (wire bonded) to the corresponding electrode pad on the surface of the semiconductor chip 1 through a bonding wire 12 that is formed of, for example, small diameter gold wire, as shown in FIG. 1. Accordingly, the semiconductor chip 1 is electrically connected to the internal terminal 9 through the bonding wire 12.

On the other hand, a plurality of external terminals 14 is provided for electrical connection with the land (electrode) on the mounting substrate (printed wiring board) on an other side surface 13 (the lower surface) of the resin substrate 4. Each of the external terminals 14 is formed in a ball shape using metal materials such as solder and disposed in a grid-like alignment. Each of the external terminals 14 is electrically connected to the island 6 or the internal terminal 9 through a metal provided within a through hole (not shown) that extends from the one side surface 5 through the other side surface 13 of the resin substrate 4.

In this semiconductor device, the other side surface 13 of the resin substrate 4 is opposed to the mounting substrate, and each of the external terminals 14 is connected to the land on the mounting substrate in order to achieve the surface mounting onto the mounting substrate. In other words, since the internal terminal 9 on the one side surface 5 of the resin substrate 4 and the external terminal 14 on the other side surface 13 of the resin substrate 4 are electrically connected with each other, when the external terminal 14 is connected to the land on the mounting substrate, an electrical connection can be achieved between the land and the internal terminal 9, which in turn can achieve an electrical connection between the land and the semiconductor chip 1.

Additionally, in this semiconductor device, the soldering material 11 is adopted as a bonding material for bonding the back surface 10 of the semiconductor chip 1 to the junction plane 7 of the island 6. This allows the semiconductor device to be mounted onto the mounting substrate and at the same time a predetermined external terminal 14 to be connected to the ground electrode on the mounting substrate, so that the back surface 10 of the semiconductor chip 1 is electrically connected to the ground electrode. In this manner, the back surface of the semiconductor chip 1 acts as a ground potential and can ensure an excellent operation (the operation of the power IC) of the semiconductor chip 1.

When mounting (die bonding) the semiconductor chip 1 onto the interposer 2, a plurality of the interposers 2 can be mounted in a collective manner. More specifically, a substrate to be mounted or to be die-bonded is prepared, in which the resin substrates 4 of the plurality of interposers 2 are connected in a direction parallel with the one side surface 5 of the resin substrate 4. A creamy solder (solder paste) which is a material of the soldering material 11 is applied to the central portion (a region shown in a hatched pattern in FIG. 2) of the junction plane 7 of the island 6 on each of the resin substrates 4. Then the back surface 10 of the semiconductor chip 1 is disposed in an opposed relation with the junction plane 7. The semiconductor chip 1 is then placed on the solder applied to the junction plane 7. Thereafter, a reflow soldering is performed to melt the solder, in which the substrate to be mounted or to be die-bonded is heated at a temperature not less than the melting temperature of the solder. The semiconductor chip 1 can thus be mounted in a collective manner on the plurality of interposers 2. After the reflow soldering, the substrate to be mounted or to be die-bonded is cut into several resin substrates 4. This provides an assembly equipped with the semiconductor chip 1 on the interposer 2.

Since the area of the junction plane 7 on the island 6 is smaller in size than the area of the back surface 10 of the semiconductor chip 1, even when the soldering material 11 (a creamy solder which is the material thereof, to be exact) is applied on the junction plane 7 and the semiconductor chip 1 is disposed on the soldering material 11, the soldering material 11 does not slip off the side surface of the semiconductor chip 1. Consequently, even when the temperature of the semiconductor device changes rapidly and there may be a difference caused by a thermal shrinkage between the semiconductor chip 1 and the interposer 2 (resin substrate 4), the configuration prevents the application of the stress on the peripheral portion of the back surface 10 of the semiconductor chip 1 from the soldering material 11 and thus prevents the damages on the semiconductor chip 1.

Since the extending portions 8 extend from the respective angular portions of the island 6, even in the case where the semiconductor chip 1 is displaced closer to a certain extending portion 8 when the semiconductor chip 1 is disposed on the soldering material 11, for example, more melted liquid of the soldering material 11 is flown into the other extending portions 8, which leads the semiconductor chip 1 onto the center of the junction plane 7. This allows greater tolerance on the disposition of the semiconductor chip 1 onto the junction plane 7 and thus, as described above, allows the mounting of the semiconductor chip 1 in a collective manner onto the plurality of interposers 2. As a result, the productivity of the semiconductor device can be improved.

Figure 3:
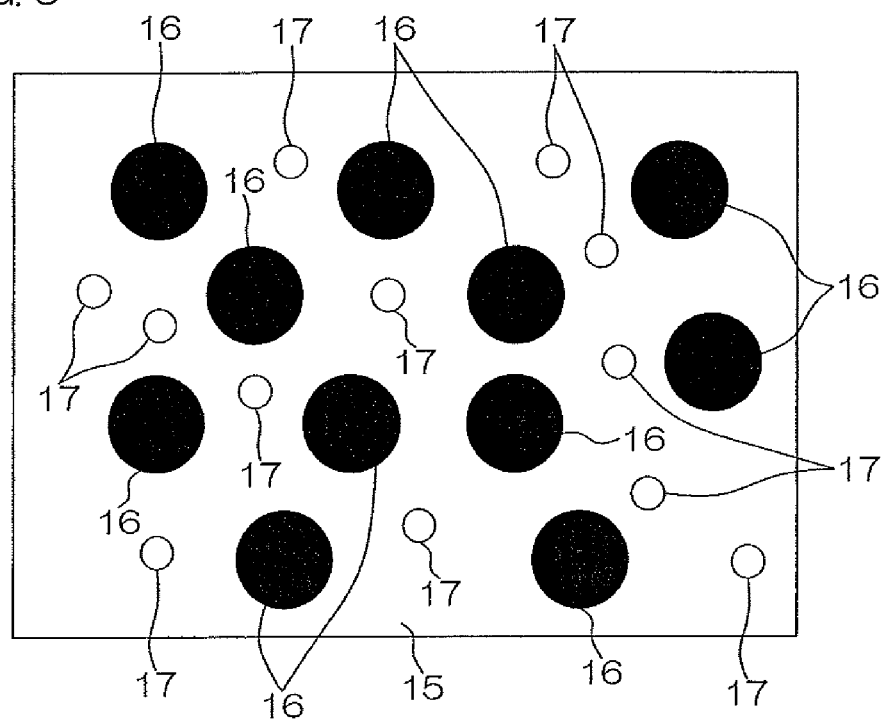
FIG. 3 is a view illustratively showing a configuration of a solder paste used in the semiconductor device shown in FIG. 1.

As the soldering material 11, the mixture of a soldering powder of a Pb-5Sn-2.5A composition and a soldering powder of 37Pb—Sn composition in the flux 15 is adopted. In addition, these soldering powders are formed, for example, in a grain size of 30 to 80 μm. As illustratively shown in FIG. 3, a soldering powder 16 which has a relatively greater grain size within the range of the aforementioned grain size and a soldering powder 17 which has a relatively smaller grain size within the range of the aforementioned grain size are mixed in the flux 15. Thus, since the mixture of the soldering powders 16 and 17 having different grain sizes leads to the high density of the soldering powders 16 and 17 in the flux 15, the generation of voids in the soldering material 11 can be prevented when melted in the reflow soldering. Further, since the melting point of the soldering powder 16 is approximately 300° C. while the melting point of the soldering powder 17 is approximately 183° C., even when voids are generated at the time of reflow soldering, the difference of the melting points serves to push the voids out of the soldering material 11. As a result, the back surface 10 of the semiconductor chip 1 and the junction plane 7 of the island 6 can achieve an excellent bonding therebetween.

Although a semiconductor device which adopts BGA is described in the aforementioned embodiment, the present invention may be applied to a semiconductor device which adopts a so called LGA (Land Grid Array) in which sheet shaped external terminals instead of ball shaped external terminals 14 are aligned. Further, the semiconductor device of the present invention is not only limited to packages equipped with an interposer such as BGA or LGB, but may also employ a package equipped with a lead frame such as QFN (Quad Flat Non-leaded Package) or SON (Small Outlined Non-leaded Package). Furthermore, the semiconductor device of the present invention is not only limited to employing these surface mounting type packages, but may also be applied to a semiconductor device which adopts a package (lead-through mounting type package) which achieves the mounting of the semiconductor device to the mounting substrate by inserting the lead of the semiconductor device into a through hole formed on the substrate.

Figure 4:
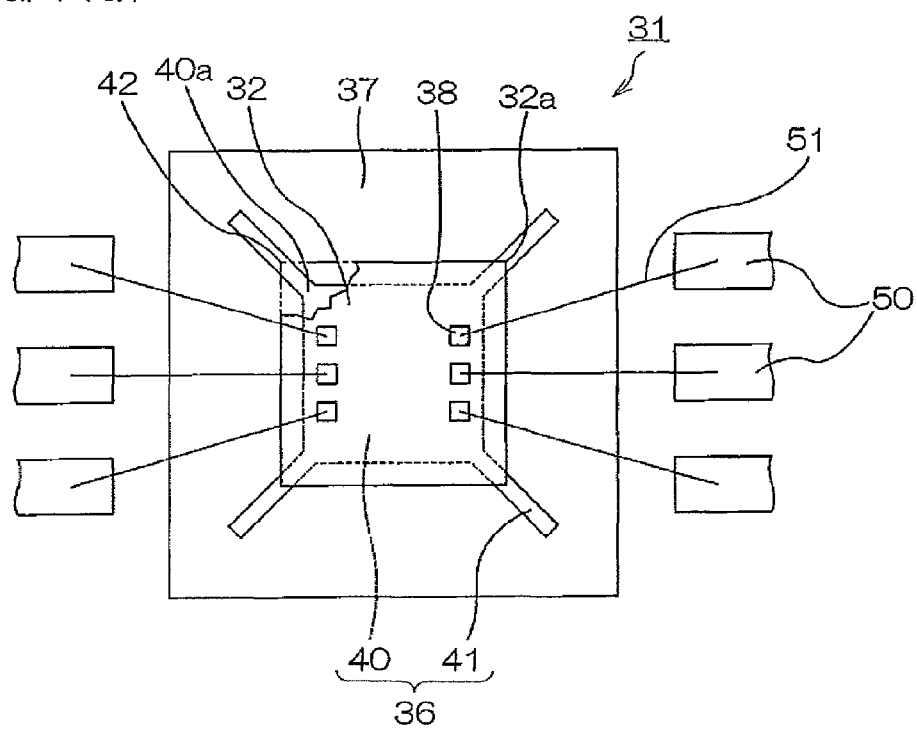
FIG. 4(a) is a perspective plan view schematically showing an example of the semiconductor device according to another embodiment of the present invention.
FIG. 4(b) is a longitudinal sectional view schematically showing the semiconductor device.
Figure 4:
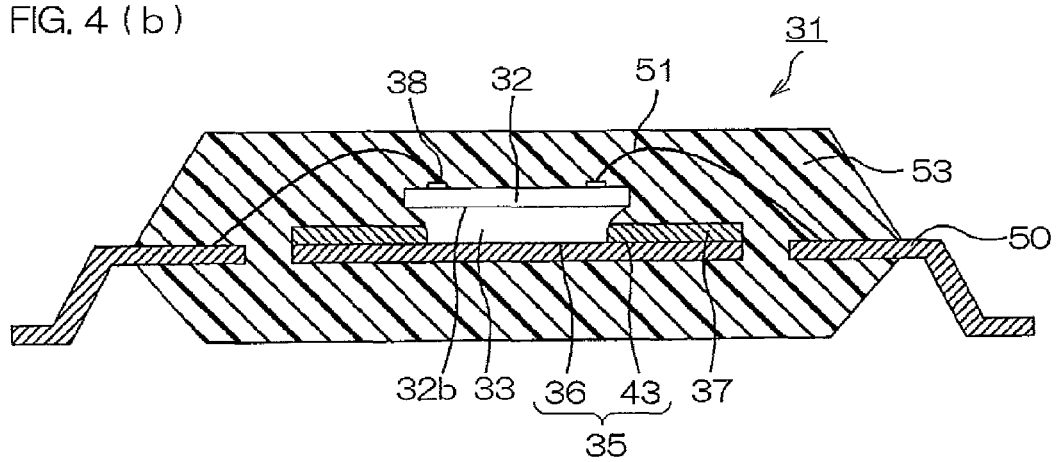

FIG. 4(*a*) is a perspective plan view schematically showing a semiconductor device according to another embodiment of the present invention, and FIG. 4(*b*) is a longitudinal sectional view schematically showing the semiconductor device.

As shown in FIGS. 4(*a*) and 4(*b*), a semiconductor device 31 includes a rectangular shape semiconductor chip 32 with a plurality of electrodes 38 formed on the surface, an island 35, lead terminals 50, wires 51, and a resin package portion 53. The resin package portion 53 is not shown in FIG. 4(*a*).

It should be noted that the semiconductor chip 32 can be any types of semiconductor chip and should not be limited to any specific functions or internal circuit configurations.

As shown in FIG. 4(*b*), the island 35 includes a coating portion 43 formed with a solder-resist layer (coating layer) 37 in which the solder 33 does not wet, and an exposed portion 36 which does not form the solder-resist layer 37 and the solder 33 is easy to wet. The semiconductor chip 32 is die-bonded with the solder (die bonding material) 33 to the exposed portion 36 in which the solder 33 is easy to wet.

The solder-resist layer 37 is formed of solder-resist materials such as an epoxy acrylate resin which does not wet the solder 33 and provided in the outer peripheral portion (coating portion 43) of the island 35.

The exposed portion 36 includes a rectangular die bonding portion 40 and rectangular alignment portions 41 which extend from respective top portions 40a of the four corners of the die bonding portion 40. The die bonding portion 40 is disposed at a position which is opposed to a back surface 32b of the semiconductor chip 32, and is smaller in size than the area of the back surface 32b of the semiconductor chip 32 as seen from top. Each of the alignment portions 41 extends from the die bonding portion 40 such that it includes an angular position 42 which is opposed to an angle 32a of the back surface 32b of the semiconductor chip 32. In FIG. 4(a), a portion (the upper left portion in the drawing) of the semiconductor chip 32 is partially broken and omitted and also the solder 33 is omitted in order to describe a relation between the angle 32a of the back surface 32b of the semiconductor chip 32 and the angular position 42 of the island 35.

In the periphery of the island 35, a plurality of lead terminals 50 is disposed in a predetermined space from the island 35. The electrode 38 formed on the surface of the semiconductor chip 32 and the lead terminal 50 are electrically connected through the wire 51. On the semiconductor device 31, the resin package portion 53 is formed to expose only a portion of the lead terminal 50 and seal the semiconductor chip 32 and the like. The resin package portion 53 is formed of, for example, a resin composition containing epoxy resin and the like.

According to the semiconductor device 31 shown in FIGS. 4(a) and 4(b), the exposed portion 36, which does not form the solder-resist layer 37 of the island 35, includes the die bonding portion 40 which is opposed to the back surface 32b of the semiconductor chip 32 and is smaller in size than the back surface 32b of the semiconductor chip 32, and the alignment portion 41 which extends from the die bonding portion 40 such that it includes the angular position 42 which is opposed to the angle 32a of the back surface 32b of the semiconductor chip 32, and the angle 32a of the semiconductor chip 32 is disposed on the alignment portion 41.

In such manner, the angle 32a of the semiconductor chip 32 is disposed on the alignment portion 41 and precisely die-bonded, and thus the nonuniform formation of the shape (loop shape) of the wire 51 can be prevented and also the space between the wires 51 can be prevented from becoming narrower.

Since the semiconductor device 31 shown in FIGS. 4(a) and 4(b) uses the solder 33 which has a relatively low viscosity at the time of melting, the solder 33 is melted in the alignment process at the time of die bonding to precisely move the angle 32a of the semiconductor chip 32 into a predetermined target position on the alignment portion 41 and the alignment of the semiconductor chip 32 can thus be precisely performed. As a result, die bonding is performed more precisely, and this can prevent the nonuniform formation of the shape (loop shape) of the wires 51 and can also prevent the space between the wires 51 from becoming narrower more securely.

With reference to the drawings, a lead frame, which is an example of the substrate according to one embodiment of the present invention, will be described hereinafter.

FIG. 5(a) is a plan view schematically showing an example of the lead flame and FIG. 5(b) is a longitudinal sectional view schematically showing the island of the lead flame.

As shown in FIG. 5(a), the lead frame 60 includes two side frames 54 which are disposed in parallel with each other, a rectangular island 35 disposed in the center of the two side frames 54, a plurality of lead terminals 50 which extends toward the island 35, a dam member 55 provided integrally so that it extends to both the right and left sides of each of the lead terminals 50 in a lateral direction, and a hanging lead 52 provided integrally to connect the side frames 54 and the island 35.

Further, as shown in FIG. 5(b), the island 35 includes a coating portion 43 which is formed with a solder-resist layer (coating layer) 37 and an exposed portion 36 which is not formed with the solder-resist layer 37. The solder-resist layer 37 is formed of a solder-resist material (epoxy acrylate resin, for example) which does not wet the solder and provided in the outer peripheral portion (coating portion 43) of the island 35.

The exposed portion 36 includes a rectangular die bonding portion 40 and rectangular alignment portions 41 each of which extended from the top portion 40a of each of the four corners of the die bonding portion 40. The die bonding portion 40 is smaller in size than the back surface of the semiconductor chip 32 (refer to FIGS. 4(a) and 4(b)) to be mounted as seen from top. Each of the alignment portions 41 extends from the die bonding portion 40 such that it includes an angular position 42 (refer to FIGS. 4(a) and 4(b)) which is opposed to the angle 32a of the back surface 32b of the semiconductor chip 32 at the time of die bonding the semiconductor chip 32.

In the lead frame 60 as shown in FIGS. 5(a) and 5(b), the exposed portion 36 of the island 35, which does not form the solder-resist layer 37, includes a die bonding portion 40 which is opposed to the back surface 32b of the semiconductor chip 32 to be die-bonded and is smaller in size than the back surface 32b of the semiconductor chip 32, and an alignment portion 41 which extends from the die bonding portion 40 such that it includes the angular position 42 which is opposed to a position where the angle 32a of the back surface 32b of the semiconductor chip 32 is positioned. Accordingly, in the alignment process (refer to FIGS. 7(c) and 7(d)) in which the semiconductor chip 32 is aligned at the time of die bonding, the solder 33 is melted to attract the angle 32a of the semiconductor chip 32 to the alignment portion 41. In such manner, the surface tension which moves the semiconductor chip 32 to a target position acts effectively for a precise alignment of the semiconductor chip 32. Consequently, the use of the lead frame 60 for manufacturing of the semiconductor device 31 can avoid failures of the semiconductor chip 32 caused by a misalignment of semiconductor chip 32.

The solder-resist layer 37 of predetermined shape is formed by using a solder-resist which does not wet the solder 33. This allows to form the portion where the solder-resist layer 37 is not formed, that is, the portion (exposed portion 36) in which the solder 33 (molten solder 33a) is easy to wet, in a particular shape. In this manner, with the use of the solder-resist, the exposed portion 36 is formed so that the surface tension which moves the semiconductor chip 32 to a target position acts effectively in accordance with the shape of the semiconductor chip to be die-bonded. Accordingly, a semiconductor device which has a different shape of the semiconductor chip can be manufactured by using a common lead frame 60 only by changing the shape of the exposed portion 36 formed on the island 35.

Figure 5:
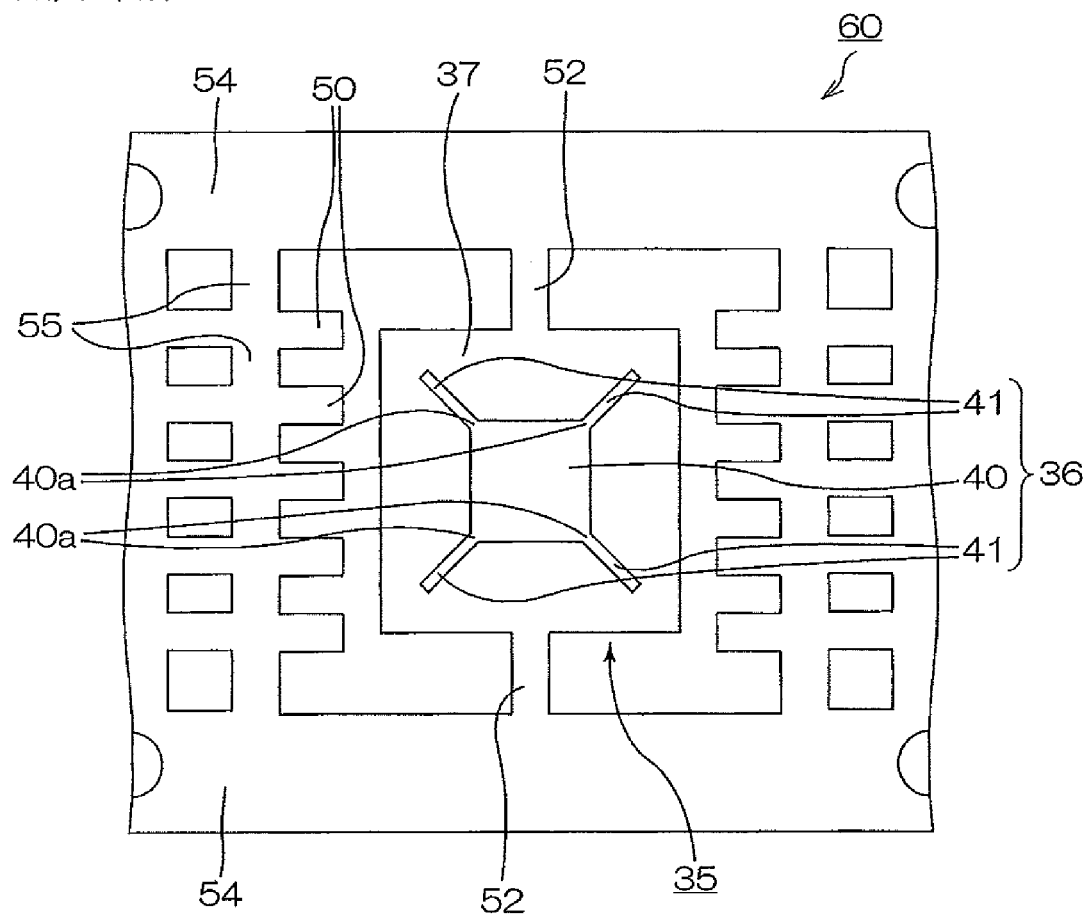
FIG. 5(a) is a perspective plan view schematically showing an example of a lead frame which is an example of the substrate according to one embodiment of the present invention.
FIG. 5(b) is a longitudinal sectional view schematically showing the island.
Figure 5:
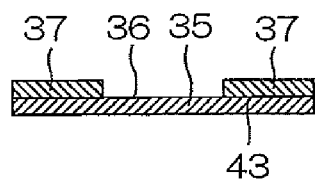

In the lead frame 60 shown in FIGS. 5(*a*) and 5(*b*), the solder 33 which has a relatively low viscosity at the time of melting is used for die bonding. Therefore, in the alignment process in which the semiconductor chip 32 is aligned at the time of die bonding, the solder 33 is melted to precisely move the angle 32*a* of the semiconductor chip 32 to a predetermined target position on the alignment portion 41 and the alignment of the semiconductor chip 32 can thus be precisely performed. As a result, die bonding can be precisely performed. Accordingly, the use of the lead frame 60 for the manufacture of the semiconductor device 31 can prevent the failure of the semiconductor device 31 caused by the misalignment of the semiconductor chip 32.

The method for manufacturing the semiconductor device according to one embodiment of the present invention will be described hereinafter with reference to FIGS. 6(*a*) and 6(*b*), and FIGS. 7(*a*) through 7(*d*).

Figure 6:
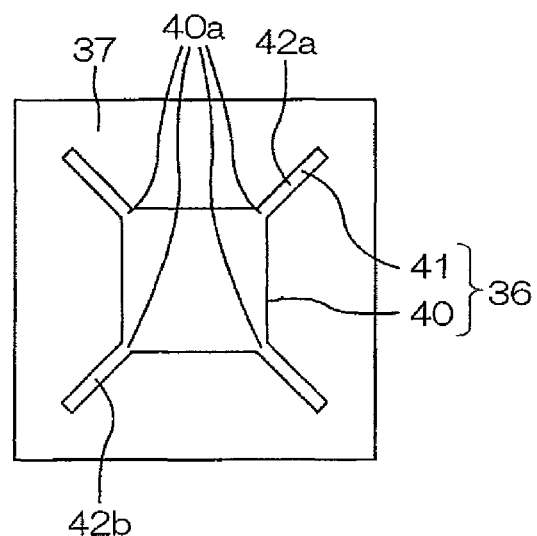
FIGS. 6(a) and 6(b) are flow charts schematically showing examples of die bonding processes according to manufacturing methods of the semiconductor device according to an embodiment of the present invention.
Figure 6:
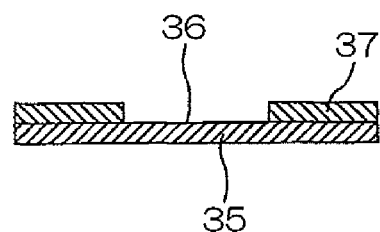
Figure 7:
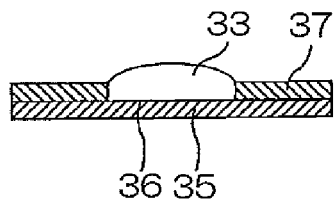
FIGS. 7(a) through 7(d) are a flow chart schematically showing an example of die bonding processes according to manufacturing method of a semiconductor device according to an embodiment of the present invention.
Figure 7:
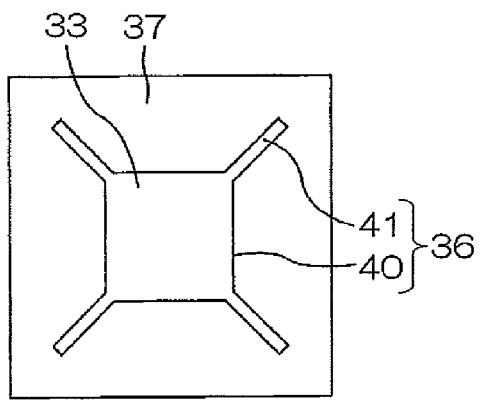
Figure 7:
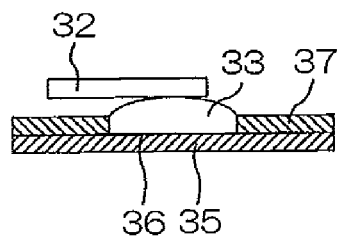
Figure 7:
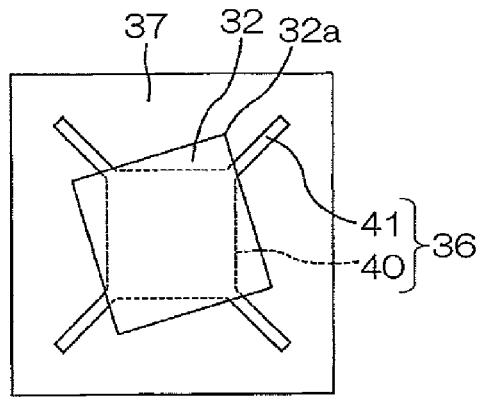
Figure 7:
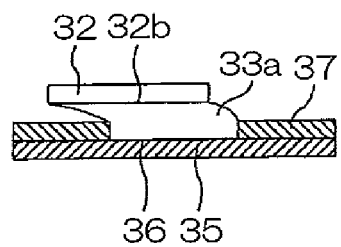
Figure 7:
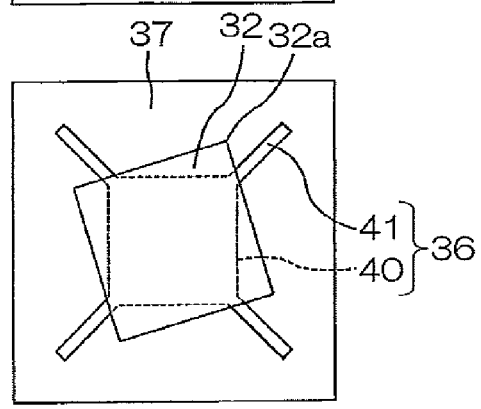
Figure 7:
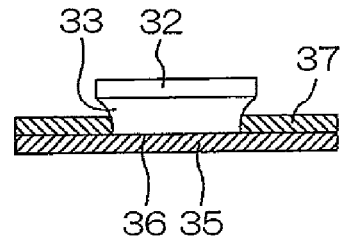
Figure 7:
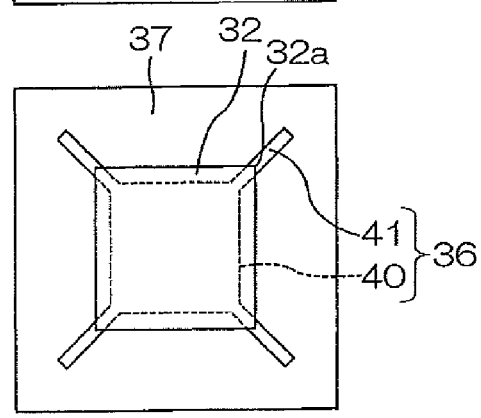

FIGS. 6(*a*) and 6(*b*), and FIGS. 7(*a*) through 7(*d*) are flow charts schematically showing examples of die bonding processes according to manufacturing methods of a semiconductor device according to one embodiment of the present invention. This embodiment describes a case in which a semiconductor chip is die-bonded to a lead frame. Portions other than the island of the lead frame will be omitted in FIGS. 6(*a*) and 6(*b*), and FIGS. 7 (*a*) through 7(*d*).

FIG. 6(*a*) is a plan view showing an example of the coating layer formation process, and FIG. 6(*b*) is the sectional view.

As shown in FIGS. 6(*a*) and 6(*b*), a solder-resist material is applied on the island 35 of the lead frame 60 (FIGS. 5(*a*) and 5(*b*)) by using a metal mask so that it is shaped in accordance with the shape of the back surface 32*b* of the semiconductor chip 32 (refer to FIGS. 4(*a*) and 4(*b*)) to be die-bonded. At this time, the solder-resist layer 37 is formed on the island 35 except for the rectangular die bonding portion 40 and the alignment portions 41 extending from the die bonding portion 40.

The die bonding portion 40 is smaller in size than the back surface 32*b* of the semiconductor chip 32 (refer to FIGS. 4(*a*) and 4(*b*)) to be mounted as seen from top.

Next, a coating process is performed in which the solder 33 is applied on the exposed portion 36 of the island 35 by using a metal mask, as shown in FIG. 7(*a*).

Next, a mounting process is performed in which the semiconductor chip 32 is pressed against the island 35 applied with the solder 33 for fixing, as shown in FIG. 7(*b*).

Next, as shown in FIG. 7(*c*), when the solder 33 is heated and melted to be the molten solder 33*a*, it spreads over the entire back surface 32*b* of the semiconductor chip 32, and the surface tension of the molten solder 33*a* moves the semiconductor chip 32. At this time, the angle 32*a* of the semiconductor chip 32 is attracted to the alignment portion 41 (refer to FIG. 8) since the die bonding portion 40 is smaller in size than the back surface 32*b* of the semiconductor chip 32. The angle 32*a* of the semiconductor chip 32 moves on the alignment portion 41 of the exposed portion 36 as shown in FIG. 7(*d*), and this completes the alignment process.

Figure 8:
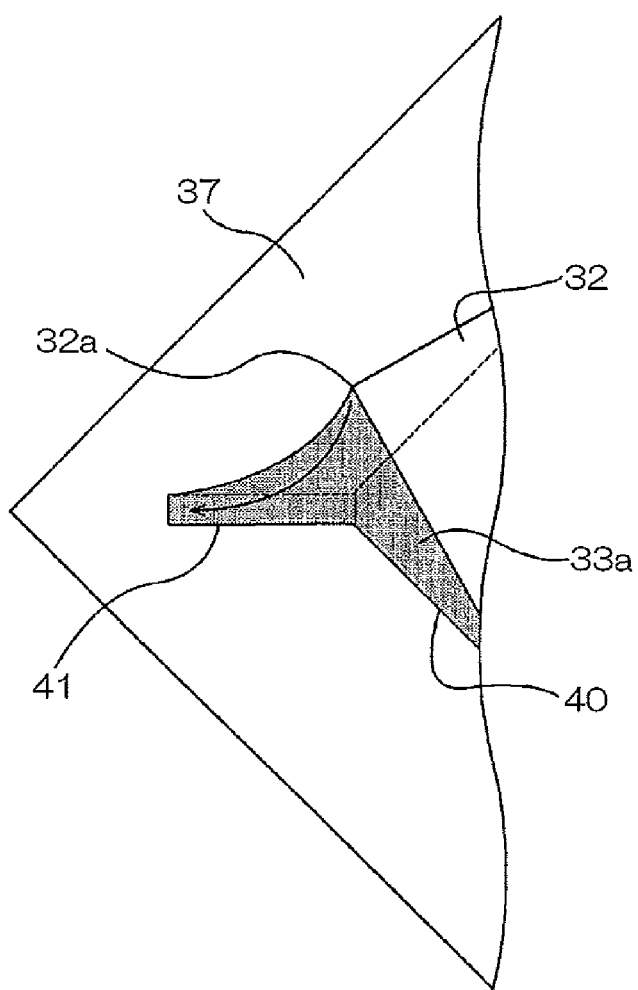
FIG. 8 is an enlarged view in the vicinity of the alignment portion of the plan view shown in FIG. 7(c).
Figure 9:
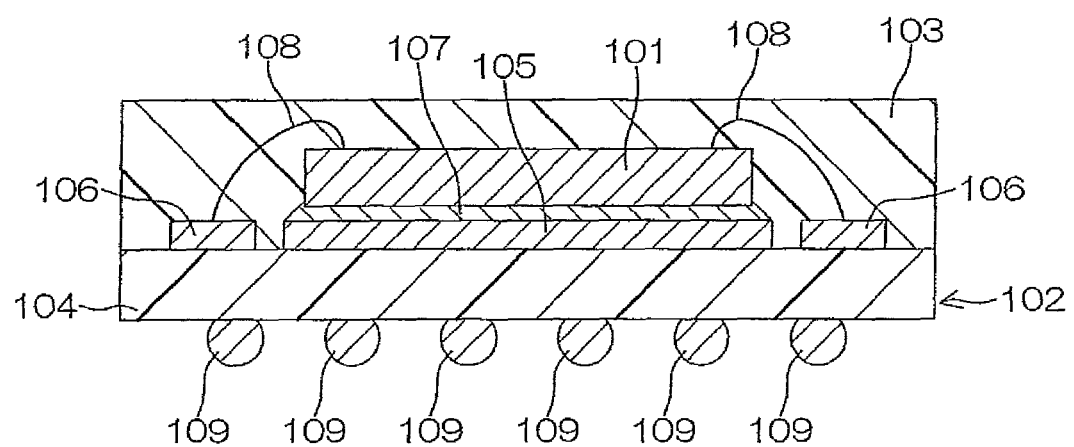
FIG. 9 is an illustrative sectional view showing a configuration of the semiconductor device which adopts BGA.
Figure 10:
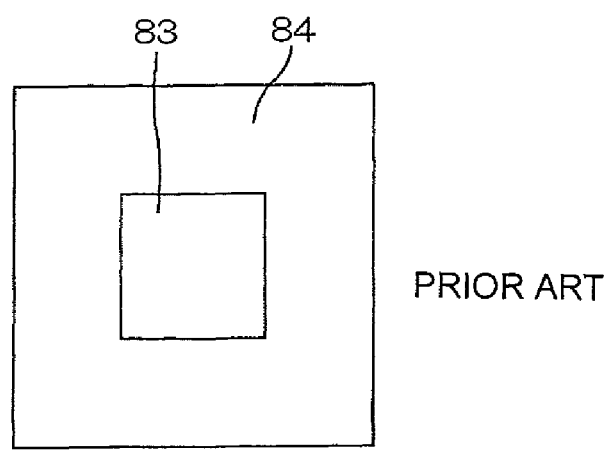
FIG. 10(a) is a plan view schematically showing an example of an island used in the conventional die bonding process and FIG. 10(b) is a longitudinal sectional view schematically showing the island.
Figure 10:
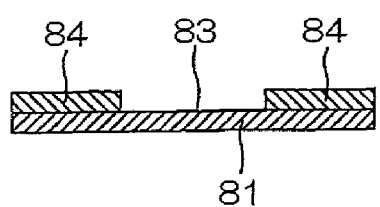

With reference to FIG. 8, the alignment of the semiconductor chip will be described in greater detail hereinafter.

FIG. 8 is an enlarged view of the vicinity of the alignment portion shown in FIG. 7(*c*).

First, the solder 33 is heated and melted. The resulted molten solder 33*a* spreads over the entire back surface 32*b* of the semiconductor chip 32 (refer to FIG. 7(*c*)). At this time, the molten solder 33*a* spreads even to the angle 32*a* of the back surface 32*b* of the semiconductor chip 32 to connect the angle 32*a* and the alignment portion 41 via the molten solder 33*a*. Then, a force is exerted on the angle 32*a* such that the angle 32*a* is attracted in a direction closer to the alignment portion 41 as shown in FIG. 8 with an arrow. In this manner, the surface tension which moves the semiconductor chip 32 to a target position acts effectively since the die bonding portion 40 is smaller in size than the back surface 32*b* of the semiconductor chip 32 and the alignment portion 41 extends from the die bonding portion 40.

According to a manufacturing method of the semiconductor device according to the present embodiment, the exposed portion 36, which does not form the solder-resist layer 37 of the island 35, includes a die bonding portion 40 which is opposed to the back surface 32*b* of the semiconductor chip 32 and is smaller in size than the back surface 32*b* of the semiconductor chip 32, and an alignment portion 41 which extends from the die bonding portion 40 such that it includes the angular position 42 which is opposed to the angle 32*a* of the back surface 32*b* of the semiconductor chip 32. With this configuration, when the semiconductor chip 32 is mounted on the island 35 and the solder 33 is melted in the subsequent alignment process, the angle 32*a* of the semiconductor chip 32 is attracted to the alignment portion 41. In such manner, the surface tension which moves the semiconductor chip 32 to a target position acts effectively for a alignment of the semiconductor chip 32 and thus failures of the semiconductor device 31 caused by a misalignment of semiconductor chip 32 can be prevented.

Further, according to the manufacturing method of the semiconductor device according to the present embodiment, the die bonding portion 40 and the alignment portion 41 are formed by using the solder-resist in such a way that the surface tension which moves the semiconductor chip 32 to a target position acts effectively in accordance with the shape of the back surface 32*b* of the semiconductor chip 32 to be die-bonded. Accordingly, even in the case where several types of the semiconductor devices which have different shapes of the semiconductor chips to be die-bonded are to be manufactured, the shapes of the die bonding portion 40 and the alignment portion 41 to be formed is simply changed corresponding to the shapes of the semiconductor chip to be die bonded. A common lead frame 60 can be thus used for the manufacturing of several types of semiconductor devices.

Further, according to the manufacturing method of the semiconductor device according to the present embodiment, the solder 33 with a relatively low viscosity at the time of melting is used. Accordingly, the solder 33 is melted to precisely move the angle 32*a* of the semiconductor chip 32 to a desired target position on the alignment portion 41. As a result, more precise die bonding can be achieved and thus failures of the semiconductor device 31 due to the misalignment of the semiconductor chip 32 can be avoided.

Although in the aforementioned embodiment the substrate is a lead frame, the substrate of the present invention should not be limited thereto, but may be an organic substrate which is formed on the surface with a metallic plate such as, silver, palladium, and gold.

Further, although in the aforementioned embodiment the semiconductor chip 32 is in a rectangular shape, the shape of the substrate of the present invention should not be limited thereto.

Further, although in the aforementioned embodiment the die bonding portion 40 is in a rectangular shape, the shape of the die bonding portion of the present invention should not be limited thereto but may be, for example, a polygonal, a circular, or an elliptical shape as long as it is smaller in size than the back surface of the semiconductor chip.

Furthermore, although in the aforementioned embodiment each of the alignment portions 41 is in a rectangular shape, the shape of the alignment portion of the present invention should not be limited thereto but may be, for example, in a wedge or elliptical shape.

Furthermore, in the aforementioned embodiment, four alignment portions 41, which include the angular positions 42 that are opposed to the angles 32a of the back surface 32b of the semiconductor chip 32 in the island 35, are provided so that it corresponds to each of the four angles 32a. However, the present invention should not be limited to this example, and the alignment portion should not necessarily be provided to correspond to all angles of the back surface of the semiconductor chip.

As in the present embodiment, it is preferable that at least a pair of angles (two pairs, in this embodiment) among angles on the corners of the semiconductor chip is disposed in a diagonal relation on the alignment portion. This is because the force exerted on each of the alignment portions that attracts the angle of the semiconductor chip is well balanced to make it easy to move the semiconductor chip to a target position.

Although in the aforementioned embodiment the alignment portions 41 are in an identical shape, the present invention should not be limited thereto but the alignment portions may be in different shapes. It is preferable that the force exerted on each of the alignment portions that attracts the angle of the semiconductor chip is well balanced in the case where the shapes of the alignment portions are different. This is because it is easy to move the semiconductor chip to a target position when the force exerted to attract the angles of the semiconductor chip is well balanced.

Although in the aforementioned embodiment the alignment portion 41 includes the angular position 42 that is opposed to the angle 32a of the back surface 32b of the semiconductor chip 32, the alignment portion of the present invention may not include a position that is opposed to the angle of the back surface of the semiconductor chip.

Further, although in the aforementioned embodiment the die bonding material is the solder 33, the die bonding material of the present invention should not be limited thereto and may be of an epoxy adhesive.

Furthermore, although in the aforementioned embodiment the coating layer is the solder-resist layer 37 formed by applying the solder-resist material, the present invention should not be limited thereto.

Furthermore, although in the aforementioned embodiment the solder-resist layer 37 is formed to provide a portion in which the solder is easy to wet and a portion in which the solder is difficult to wet, the present invention may not be limited to this example as long as a die bonding material has a portion in which the solder is easy to wet and a portion in which the solder is difficult to wet.

While the illustrative embodiments of the present invention are provided in the above description in detail, such are for illustrative purpose only and it is not to be construed restrictively. Modification and variation of the present invention is meant to be covered by the spirit and scope of the appended claims.

What is claimed is:

1. A semiconductor device, comprising:
a semiconductor chip; and
a conductive layer disposed at a back surface of the semiconductor chip;
an interposer disposed on a lower side of the conductive layer to support the semiconductor chip; and
an internal terminal formed on the interposer,
the conductive layer including:
    a first portion disposed such that an outer periphery thereof is inside an outer periphery of the semiconductor chip as seen from above; and
    a second portion extending outward from a part of the outer periphery of the first portion, wherein an end part thereof extends outward from the outer periphery of the semiconductor chip as seen from above,
wherein each of a plurality of sides of the semiconductor chip is parallel with a corresponding side of the first portion, and
a surface of the second portion of the conductive layer and a surface of the internal terminal are in the same plane.

2. The semiconductor device according to claim 1, further comprising a bonding wire connecting a front surface of the semiconductor chip and the internal terminal.

3. The semiconductor device according to claim 1, wherein the semiconductor chip includes a surface protective film covering an uppermost surface of the semiconductor chip.

4. The semiconductor device according to claim 1, wherein the internal terminal includes a plurality of internal terminals, and the plurality of internal terminals are spaced from each other surrounding the conductive layer as seen from above.

5. The semiconductor device according to claim 1, further comprising an external terminal provided on an opposite surface of the interposer from a surface of the interposer on which the conductive layer is provided.

6. The semiconductor device according to claim 5, wherein the external terminal is formed in a ball shape using a metal material.

7. The semiconductor device according to claim 5, wherein the external terminal includes a plurality of external terminals, and the plurality of the external terminals are disposed in a grid-like arrangement.

8. The semiconductor device according to claim 1, further comprising a bonding layer interposed between the back surface of the semiconductor chip and the conductive layer.

* * * * *